United States Patent
Lin et al.

(10) Patent No.: US 8,416,600 B2
(45) Date of Patent: Apr. 9, 2013

(54) REVERSE CONNECTION MTJ CELL FOR STT MRAM

(75) Inventors: Chun-Jung Lin, Hsinchu (TW); Yu-Jen Wang, Hsinchu (TW); Ya-Chen Kao, Taoyuan County (TW); Wen-Cheng Chen, Hsinchu (TW); Ming-Te Liu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 249 days.

(21) Appl. No.: 12/626,092

(22) Filed: Nov. 25, 2009

(65) Prior Publication Data

US 2011/0122674 A1 May 26, 2011

(51) Int. Cl.
*G11C 11/00* (2006.01)

(52) U.S. Cl.
USPC .......................................... 365/148; 365/158

(58) Field of Classification Search .................. 365/148, 365/158
See application file for complete search history.

(56) References Cited

U.S. PATENT DOCUMENTS

| | | | |
|---|---|---|---|
| 2005/0072997 A1* | 4/2005 | Kikuchi et al. | 257/295 |
| 2007/0285974 A1* | 12/2007 | Takemura et al. | 365/158 |
| 2008/0007991 A1* | 1/2008 | Diteweg et al. | 365/158 |
| 2008/0205125 A1* | 8/2008 | Kajiyama et al. | 365/158 |
| 2009/0201717 A1* | 8/2009 | Maeda et al. | 365/148 |
| 2009/0310400 A1* | 12/2009 | Takemura et al. | 365/158 |
| 2010/0039136 A1* | 2/2010 | Chua-Eoan et al. | 326/38 |
| 2010/0220516 A1* | 9/2010 | Lee et al. | 365/158 |
| 2010/0302838 A1* | 12/2010 | Wang et al. | 365/158 |
| 2011/0064969 A1* | 3/2011 | Chen et al. | 428/800 |

* cited by examiner

*Primary Examiner* — Hoai V Ho
(74) *Attorney, Agent, or Firm* — Haynes and Boone, LLP

(57) ABSTRACT

Apparatus and methods are disclosed herein for a reverse-connection STT MTJ element of a MRAM to overcome the source degeneration effect when switching the magnetization of the MTJ element from the parallel to the anti-parallel direction. A memory cell of a MRAM having a reverse-connection MTJ element includes a switching device having a source, a gate, and a drain, and a reverse-connection MTJ device having a free layer, a fixed layer, and an insulator layer interposed between the free layer and the fixed layer. The free layer of the reverse-connection MTJ device is connected to the drain of the switching device and the fixed layer is connected to a bit line (BL). The reverse-connection MTJ device applies the lower $I_{MTJ}$ capability of the memory cell caused by the source degeneration effect to the less stringent $I_{MTJ}$ (AP->P) while preserving the higher $I_{MTJ}$ capability for the more demanding $I_{MTJ}$(P->AP).

20 Claims, 6 Drawing Sheets

REVERSE CONNECTION MTJ CELL FOR STT MRAM

TECHNICAL FIELD

The present disclosure relates generally to magnetic random access memory (MRAM) devices. Specifically, the present disclosure relates to a magnetic tunnel junction (MTJ) MRAM cell that uses spin torque transfer (STT) for data write.

BACKGROUND

MRAM is a nonvolatile memory technology that uses magnetization to represent stored data. Generally, MRAM includes a plurality of magnetic cells in an array. Each cell typically represents one bit of data. Included in the cells are magnetic elements. A magnetic element may include two ferromagnetic "plates" (or layers upon a semiconductor substrate) each of which has a magnetization direction (or orientation of magnetic moments) associated with it. The two ferromagnetic plates are separated by a thin non-magnetic layer.

More specifically, a MRAM element is often based on a magnetic tunnel junction (MTJ) element. An MTJ element includes at least three basic layers: a "free layer," a tunneling barrier layer, and a "fixed layer." The free layer and the fixed layer are ferromagnetic layers; the tunneling barrier layer is a thin insulator layer located between the free layer and the fixed layer. The magnetization direction of the free layer is free to rotate, but is constrained by the physical size of the layer to point in either of two directions; the magnetization of the fixed layer is fixed in a particular direction. A bit is written to the MTJ element by orienting the magnetization direction of the free layer in one of the two directions. Depending upon the orientations of the magnetic moments of the free layer and the fixed layer, the resistance of the MTJ element will change. Thus, the bit may be read by determining the resistance of the MTJ element. When the magnetization direction of the free layer and the fixed layer are parallel and the magnetic moments have the same polarity, the resistance of the MTJ element is low. Typically, this is designated a "0." When the magnetization direction of the free layer and the fixed layer are anti-parallel and the magnetic moments have the opposite polarity, the resistance of the MTJ is high. Typically, this is designated a "1."

Spin torque transfer (STT) (also known as spin transfer switching or spin-transfer effect) is one technique for writing to MTJ memory elements. STT is based upon the idea that when a spin-polarized current (most of the electrons of the current have spins aligned in the same direction) is applied to a free ferromagnetic layer, the electrons may transfer their spin angular momentum to the free layer to switch the direction of magnetization of the free layer. The advantages of using STT for writing to magnetic elements include smaller bit size and lower writing current requirement. However, in STT the switch current required to switch the magnetization direction of the MTJ element from parallel to anti-parallel is 20-50% larger than that required to switch from anti-parallel to parallel. Furthermore, in a conventional STT MTJ element the larger parallel-to-anti-parallel switching current is limited by a "source degeneration" or the so called "source-site loading" effect. This source degeneration effect constrains the amount of current flowing through the MTJ element and may prevent the MTJ element from switching the magnetization direction from anti-parallel to parallel reliably. Accordingly, it is desirable to have a STT MTJ element that is not limited by the source degeneration effect to ensure reliable switching of the magnetization direction of the MTJ element from parallel to anti-parallel.

BRIEF SUMMARY

Apparatus and methods are disclosed herein for a reverse-connection STT MTJ element of a MRAM to overcome the source degeneration effect when switching the magnetization direction of the MTJ element from the parallel to the anti-parallel direction.

In accordance with one or more embodiments of the present disclosure, a memory cell of a MRAM is disclosed. The memory cell includes a switching device having a source, a gate, and a drain, and a MTJ device having a free layer, a fixed layer, and an insulator layer that is interposed between the free layer and the fixed layer. The free layer of the MTJ device is connected to the drain of the switching device; the fixed layer of the MTJ device is connected to a bit line (BL); the gate of the switching device is connected to a word line (WL); and the source of the switching device is connected to a sense line (SL).

In accordance with one or more embodiments of the present disclosure, a method for forming a memory cell of a MRAM is disclosed. The method includes forming a substrate and forming a switching device having a source region, an active region, and a drain region. The method also includes forming a MTJ device having a free layer, a fixed layer, and an insulator layer that is interposed between the free layer and the fixed layer. The method further includes connecting the source region to a sense line (SL), forming a write line (WL) to control the switching device through the active region, connecting the drain region to the free layer, and connecting the fixed layer to a bit line (BL).

In accordance with one or more embodiments of the present disclosure, a memory device is disclosed. The memory device includes a memory cell having a substrate; a switching device including a source region, an active region, and a drain region; and a magnetic tunnel junction (MTJ) device including a free layer connected to the drain region, a fixed layer, and an insulator layer, wherein the insulator layer is interposed between the free layer and the fixed layer. The memory device also includes a sense line (SL) connected to the source region, a write line (WL) to control the switching device through the active region, and a bit line (BL) connected to the fixed layer of the MTJ device. The memory device is provided such that a current capability of the memory cell is more than a required current to switch a magnetization direction of the free layer to be parallel to a magnetization direction of the fixed layer, and more than a required current to switch the magnetization direction of the free layer to be anti-parallel to the magnetization direction of the fixed layer.

These and other embodiments of the present disclosure will be more fully understood by reference to the following detailed description when considered in conjunction with the following drawings.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
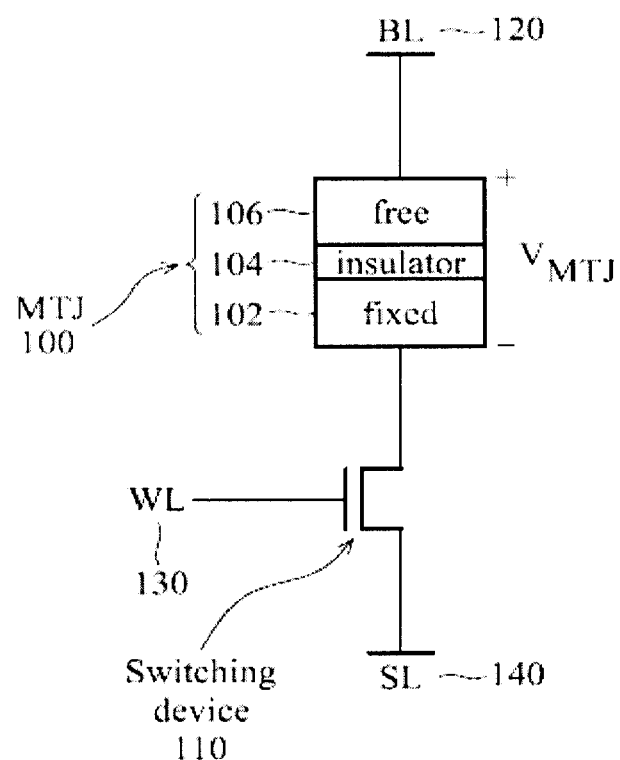
FIG. 1 shows a memory cell of a MRAM.

The present disclosure relates to a MTJ cell of a MRAM that is not limited by the source degeneration effect when switching the magnetization direction of the MTJ cell. It is understood that the present disclosure provides many different forms and embodiments, and that specific embodiments are provided only as examples. Further, the scope of the present disclosure will only be defined by the appended claims. In the drawings, the sizes and relative sizes of layers and regions may be exaggerated for clarity. It will be understood that when an element or layer is referred to as being "on," "connected to" or "coupled to" another element or layer, it may be directly on, connected to, or coupled to the other element or layer, or intervening elements or layers may be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Hereinafter, embodiments of the present invention will be explained in detail with reference to the accompanying drawings.

FIG. 1 shows a memory cell of a MRAM. The memory cell includes a magnetic memory element such as a MTJ device 100 and a switching device 110. MTJ device 100 includes a fixed layer 102, a tunneling barrier layer or an insulator layer 104, and a free layer 106. The magnetization of the free layer 106 is free to rotate to point in one of two directions and may be switched using spin-torque transfer (STT). For the fixed layer 102, an anti-ferromagnetic layer may be used to fix, or pin, its magnetization in a particular direction. The insulator layer 104 is sandwiched between the free layer 106 and the fixed layer 102. The free layer 106 is connected to a bit line (BL) 120 which provides the free layer with a voltage in a read or write operation. The fixed layer 102 is connected to the drain of the switching device 110.

The switching device 110 is used to read from, or write to the MTJ device 100. Embodiments of the switching device 110 include a metal oxide semiconductor (MOS) transistor, an MOS diode, and/or a bipolar transistor. The gate of the switching device 110 is connected to a word line (WL) 130, which may activate the memory cell for a read or write operation. The source of the switching device 110 is connected to a sense line (SL) 140, which may drive the fixed layer 102 with a voltage in a read or write operation when activated by the WL 130.

Data in the MTJ device 100 is represented by the magnetization direction of the free layer 106 relative to the fixed layer 102. When the magnetization of the free layer and the pinned layer are parallel and the magnetic moments have the same polarity, the resistance of the MTJ device is low. Typically, this is designated a "0" state. When the magnetization of the free layer and the pinned layer are anti-parallel and the magnetic moments have the opposite polarity, the resistance of the MTJ device is high. Typically, this is designated a "1" state.

STT is a technique for writing to the MTJ device 100 by switching the magnetic moment of the free layer 106. The voltage across the MTJ device 100 from the free layer to the fixed layer 102 may be represented by $V_{MTJ}$. To write a "0" into the MTJ device 100, $V_{MTJ}$ is positively biased so that the free layer 106 is at a positive voltage with respect to the fixed layer 102. This may be accomplished by applying a positive voltage to the BL 120, tying SL 140 to ground, and activating the switching device 110 through the WL 130.

For example, the magnetic moments of the free layer 106 are assumed initially to be anti-parallel to those of the fixed layer 102 so that the MTJ device 100 is at the "1" state. To switch the magnetic moments of the free layer 106 to be parallel to those of the fixed layer 102, a positive voltage is applied across $V_{MTJ}$. The positive $V_{MTJ}$ causes conduction electrons to travel from the fixed layer 102 to the free layer 106. The majority of electrons traveling from the fixed layer 102 have their spins polarized in the same direction as the magnetic moments of the fixed layer 102. Because the magnetic direction of the MTJ device 100 is initially anti-parallel, this spin angular momentum is also anti-parallel to the magnetic moments of the free layer 106. These electrons interact with the magnetic moments of the free layer 106 near the interface between the free layer 106 and the insulator layer 104. Because of this interaction, the electrons transfer their spin angular momentum to the free layer 106. If $V_{MTJ}$ is sufficiently positive, a sufficient number of conduction electrons may transfer sufficient angular momentum to the free layer 106 to switch the magnetic moments of the free layer 106 to be parallel to the magnetic moments of the fixed layer 102.

Figure 2:
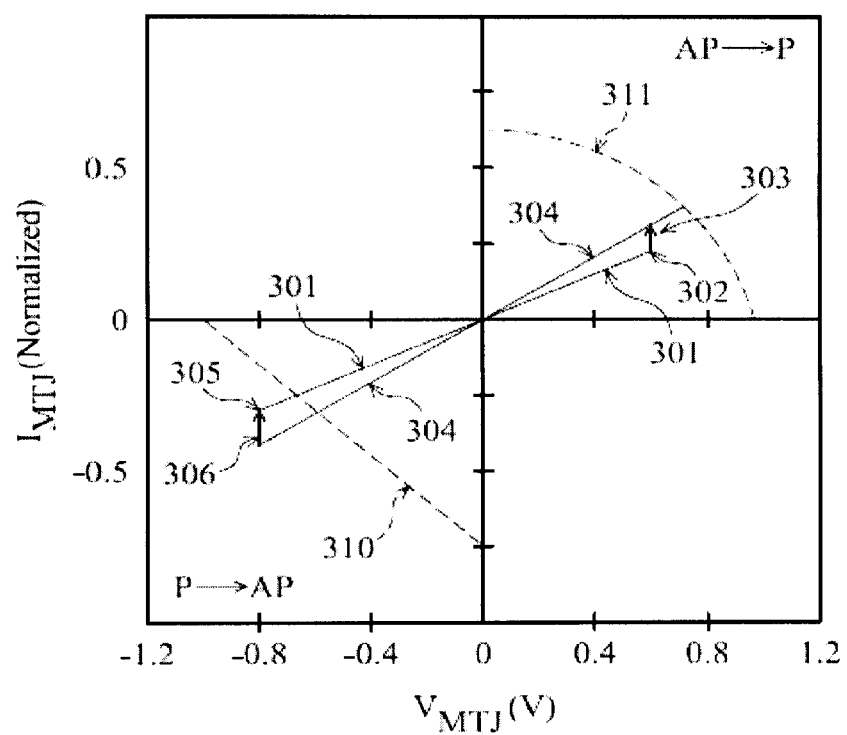
FIG. 2 shows the $V_{MTJ}/I_{MTJ}$ characteristics of the memory cell of FIG. 1.

FIG. 2 shows a graph of the current $I_{MTJ}$ flowing through the MTJ device 100 of FIG. 1 as a function of the $V_{MTJ}$. If initially the MTJ device 100 is in the "1" state, the resistance of the MTJ device 100 is high. As an increasingly positive $V_{MTJ}$ is applied, the $I_{MTJ}$ may increase along the "1" state curve 301 in the upper right quadrant of FIG. 2. When the $V_{MTJ}$ reaches point 302, sufficient angular momentum of the conduction electrons is transferred to the free layer 106 to switch the MTJ device 100 from the "1" state to the "0" state. The magnetic moments of the free layer 102 become parallel to those of the fixed layer 104 and the resistance of the MTJ device 100 drops from high resistance to low resistance. Consequently, $I_{MTJ}$ jumps along 303 to transition to the "0" state curve 304. The $I_{MTJ}$ at which the magnetic moments of the free layer 106 switch from the anti-parallel direction to the parallel direction is denoted by $I_{MTJ}(AP\text{->}P)$. $I_{MTJ}(AP\text{->}P)$ is typically in the 100-200 µA range. As the $V_{MTJ}$ is continually increased, the $I_{MTJ}$ may increase along the "0" state curve 304. Conversely, as the $V_{MTJ}$ is decreased, the $I_{MTJ}$ may decrease along the "0" state curve 304.

To write a "1" into the MTJ device 100, $V_{MTJ}$ is negatively biased. For example, starting from the MTJ device in the "0"

state, where the magnetic moments of the free layer 106 are parallel to those of the fixed layer 102, a negative voltage is applied across $V_{MTJ}$ to write a "1" into the MTJ device 100. This may be accomplished by tying BL 120 to ground, applying a positive voltage to SL 140, and activating the switching device 110 through the WL 130. The negative $V_{MTJ}$ causes conduction electrons to travel from the free layer 106 to the fixed layer 102. The majority of electrons traveling from the free layer 106 have their spins polarized in the same direction as the magnetic moments of the free layer 106. The spin angular momentum of these majority electrons is also parallel to the magnetic moments of the fixed layer 102. These majority electrons are transmitted through the fixed layer 102. However, a minority of electrons, which have spins polarized anti-parallel to the magnetic moments of the free layer 106 and of the fixed layer 102, will be reflected from the fixed layer 102 and travel back to the free layer 106. The reflected minority electrons interact with the magnetic moments of the free layer 106 near the interface between the free layer 106 and the insulator layer 104. Because of this interaction, the minority electrons transfer a portion of their spin angular momentum to the free layer 106. If $V_{MTJ}$ is sufficiently negative, a sufficient number of conduction electrons may transfer sufficient angular momentum to the free layer 106 to switch the magnetic moments of the free layer 106 to be anti-parallel to the magnetic moments of the fixed layer 102.

Referring back to FIG. 2, initially the MTJ device 100 is characterized by the "0" state curve 304, representing the MTJ device 100 in the low resistance state. As an increasingly negative $V_{MTJ}$ is applied, the $I_{MTJ}$ may increase in the negative direction along the "0" state curve 304 in the lower left quadrant of FIG. 2. When the $V_{MTJ}$ reaches point 305, sufficient angular momentum of the minority conduction electrons with spins polarized anti-parallel to the magnetic moments of the free layer 106 is transferred to the free layer 106 to switch the MTJ device 100 from the "0" state to the "1" state. The magnetic moments of the free layer 102 become anti-parallel to those of the fixed layer 104, and the resistance of the MTJ device 100 rises from low resistance to high resistance. Consequently, $I_{MTJ}$ drops along 306 to transition to the "1" state curve 301, which represents the MTJ device 100 in the high resistance state. The $I_{MTJ}$ at which the magnetic moments of the free layer 106 switch from the parallel direction to the anti-parallel direction is denoted by $I_{MTJ}$(P->AP). $I_{MTJ}$(P->AP) is generally 20-50% higher than $I_{MTJ}$(AP->P) and is typically in the 200-300 μA range.

Thus, to switch the MTJ device 100 from "0" to the "1" state, $V_{MTJ}$ is negatively biased. In the memory cell of FIG. 1, the free layer 106 is connected to the BL 120 and the fixed layer 102 is connected to the drain of the switching device 110. The negative $V_{MTJ}$ causes the switching device 110 to drive current from the source (SL 140) to the drain. However, a phenomenon known as a "source degeneration" effect limits the amount of current the switching device 110 may provide.

Referring again to FIG. 2, curve 310 characterizes the $I_{MTJ}$ capability of the memory cell of FIG. 1 as a function of $V_{MTJ}$ when $V_{MTJ}$ is negatively biased for switching the magnetic moments of the free layer 106 from the parallel to the anti-parallel direction. Curve 311 characterizes the $I_{MTJ}$ capability of the memory cell as a function of $V_{MTJ}$ when $V_{MTJ}$ is positively biased for switching the magnetic moments of the free layer 106 from the anti-parallel to the parallel direction. Due to the source degeneration effect, the $I_{MTJ}$ capability of curve 310 is degraded with respect to that of curve 311. That is, the maximum $I_{MTJ}$ the memory cell can support when switching from "0" to "1" for a $V_{MTJ}$ biased in the negative direction is less than the maximum $I_{MTJ}$ it can support when switching from "1" to "0" for the same $V_{MTJ}$ biased in the positive direction. However, it is when switching from "0" to "1" where the $I_{MTJ}$ capability has to be higher to support the higher $I_{MTJ}$(P->AP) requirement. As shown in the lower left quadrant of FIG. 2, the degraded $I_{MTJ}$ capability of curve 310 may not be sufficient to support the $I_{MTJ}$(P->AP) to switch the MTJ device 100. Thus, the memory cell may not switch reliably from the "0" to the "1" state.

Figure 3:
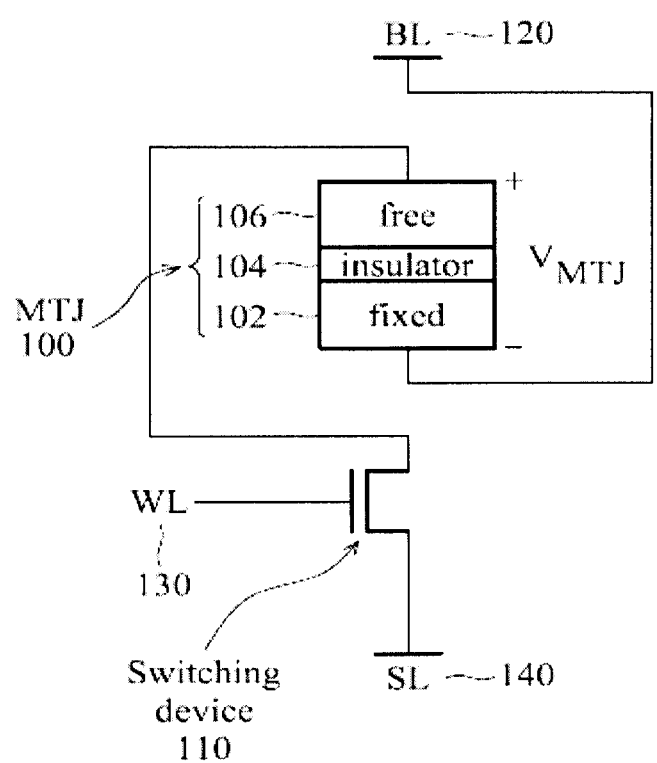
FIG. 3 shows a MRAM memory cell with a reverse connection MTJ device according to one or more embodiments of the present disclosure.

FIG. 3 shows a memory cell of a MRAM with a reverse connection MTJ device according to one or more embodiments of the present disclosure. The memory cell also includes a MTJ device 100 and a switching device 110. However, the free layer 106 is now connected to the drain of the switching device 110, and the fixed layer is connected to BL 120. The gate of the switching device 110 is still connected to WL 130 and the source is still connected to SL 140. Thus, the connections to the free layer 106 and the fixed layer 102 of FIG. 3 are reversed from the connections for the memory cell of FIG. 1.

To write a "0" into the reverse connection MTJ device 100, $V_{MTJ}$ is positively biased by tying BL 120 to ground, applying a positive voltage to SL 140, and activating the switching device 110 through the WL 130. Conversely, to write a "1" into the reverse connection MTJ device 100, $V_{MTJ}$ is negatively biased by applying a positive voltage to BL 120, tying SL 140 to ground, and activating the switching device 110 through the WL 130.

Figure 4:
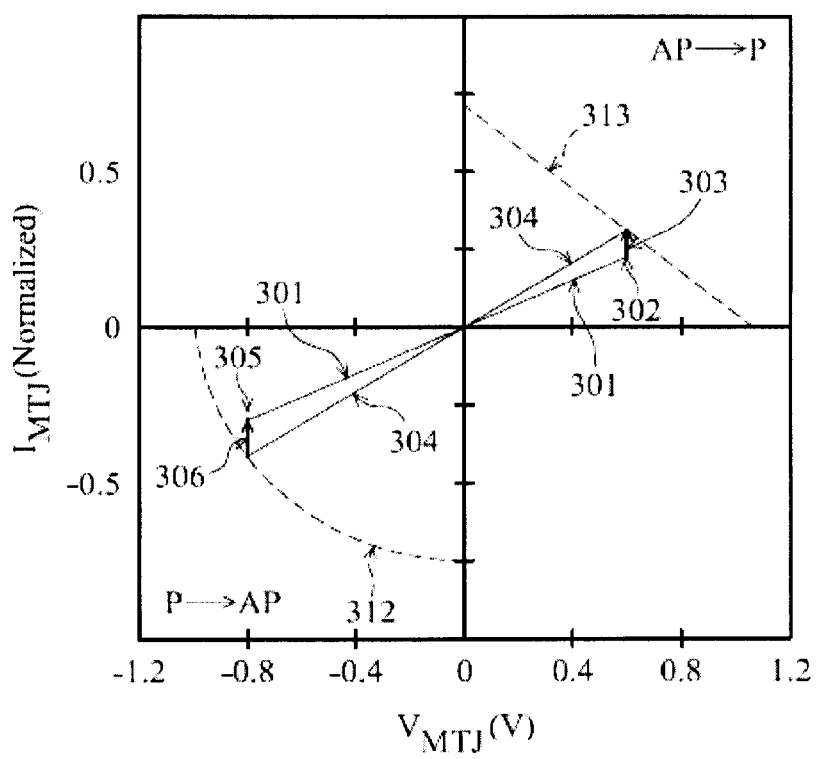
FIG. 4 shows $V_{MTJ}/I_{MTJ}$ characteristics of a memory cell with a reverse connection MTJ device of FIG. 3.

FIG. 4 shows a graph of the $V_{MTJ}/I_{MTJ}$ characteristics of a memory cell with a reverse connection MTJ device of FIG. 3 according to one or more embodiments of the present disclosure. The $I_{MTJ}$ flowing through the MTJ device 100 as a function of the $V_{MTJ}$ is characterized by the "0" state curve 304 and the "1" state curve 301, which are identical to the "0" state curve 304 and the "1" state curve 301 of FIG. 2. Similarly, the $I_{MTJ}$(P->AP) and $I_{MTJ}$(P->AP) requirements are still characterized as in FIG. 2. However, because of the topology of the reverse connection MTJ device 100, when switching the MTJ device 100 from "0" to the 1" state, the current flows from the BL 120 through the MTJ device 100 and through the switching device 110 to SL 140. This direction of current flow when switching the MTJ device of FIG. 4 from "0" to the "1" state is the same as the direction of current flow when switching the memory cell of FIG. 1 from "1" to the "0" state. Therefore, the $I_{MTJ}$ capability of the memory cell with the reverse connection MTJ device when switching from the parallel to the anti-parallel direction is the same as that for the memory cell of FIG. 1 when switching from the anti-parallel to the parallel direction.

As shown in the lower left quadrant of FIG. 4, curve 312 characterizes the $I_{MTJ}$ capability of the memory cell with the reverse connection MTJ device for switching the magnetic moments of the free layer 106 from the parallel to the anti-parallel direction. Curve 312 has the same characteristics as curve 311 of FIG. 2. It is seen that the $I_{MTJ}$ capability of curve 312 does not suffer from the source degeneration effect. Therefore, the memory cell with the reverse connection MTJ device is able to support the higher $I_{MTJ}$(P->AP) requirement and the memory cell may switch reliably from the "0" to the "1" state.

Conversely, when switching the MTJ device 100 of FIG. 3 from the "1" to the 0" state, the current flows from the SL 140 through the switching device 110 to the BL 120. This direction of current flow is the same as that when switching the memory cell of FIG. 1 from "0" to the "1" state. Curve 313 of FIG. 4 characterizes the $I_{MTJ}$ capability of the memory cell with the reverse connection MTJ device for switching the magnetic moments of the free layer 106 from the anti-parallel to the parallel direction. Curve 313 has the same characteristics as curve 310 of FIG. 2. Therefore, the $I_{MTJ}$ capability of curve 313 suffers from the source degeneration effect of curve 310. However, because the $I_{MTJ}$(AP->P) requirement is less stringent, it is seen that the $I_{MTJ}$ capability of curve 313 is still able to support the $I_{MTJ}$(AP->P) as shown in the upper right quadrant of FIG. 4. Thus, the memory cell with the reverse connection MTJ device may still switch reliably from the "1" to the "0" state.

Thus, contrary to the memory cell of FIG. 1, the memory cell with the reverse connection MTJ device 100 of FIG. 3 applies the lower $I_{MTJ}$ j capability caused by the source degeneration effect to the less stringent $I_{MTJ}$(AP->P) while preserving the higher $I_{MTJ}$ capability for the more demanding $I_{MTJ}$ (P->AP). As shown in FIG. 4, embodiments of the present disclosure bound the "1" state curve 301, the "0" state curve 304, the $I_{MTJ}$ (AP->P), and the $I_{MTJ}$(AP->AP) entirely within the $I_{MTJ}$ capability curves of 312 and 313 to help ensure that the MTJ device 104 may switch reliably in both directions.

The bit value stored in the memory cell of FIG. 3 as represented by the magnetization direction of the MTJ device 100 may be read by measuring the read current as determined by the resistance of the MTJ device 100. A read current may be measured by applying a voltage to BL 120 and by turning on the switching device 110 from WL 130. When the magnetization moments of the free layer 106 are parallel, as when the MTJ device 100 stores a "0" bit, the resistance of the MTJ device 100 is low. The measured current will be higher as shown by the "0" state curve 304 of FIG. 4. Conversely, when the magnetization moments of the free layer 106 are anti-parallel, as when the MTJ device 100 stores a "1" bit, the resistance of the MTJ device 100 is high. The measured current will be low as shown by the "1" state curve 301 of FIG. 4.

Figure 5:
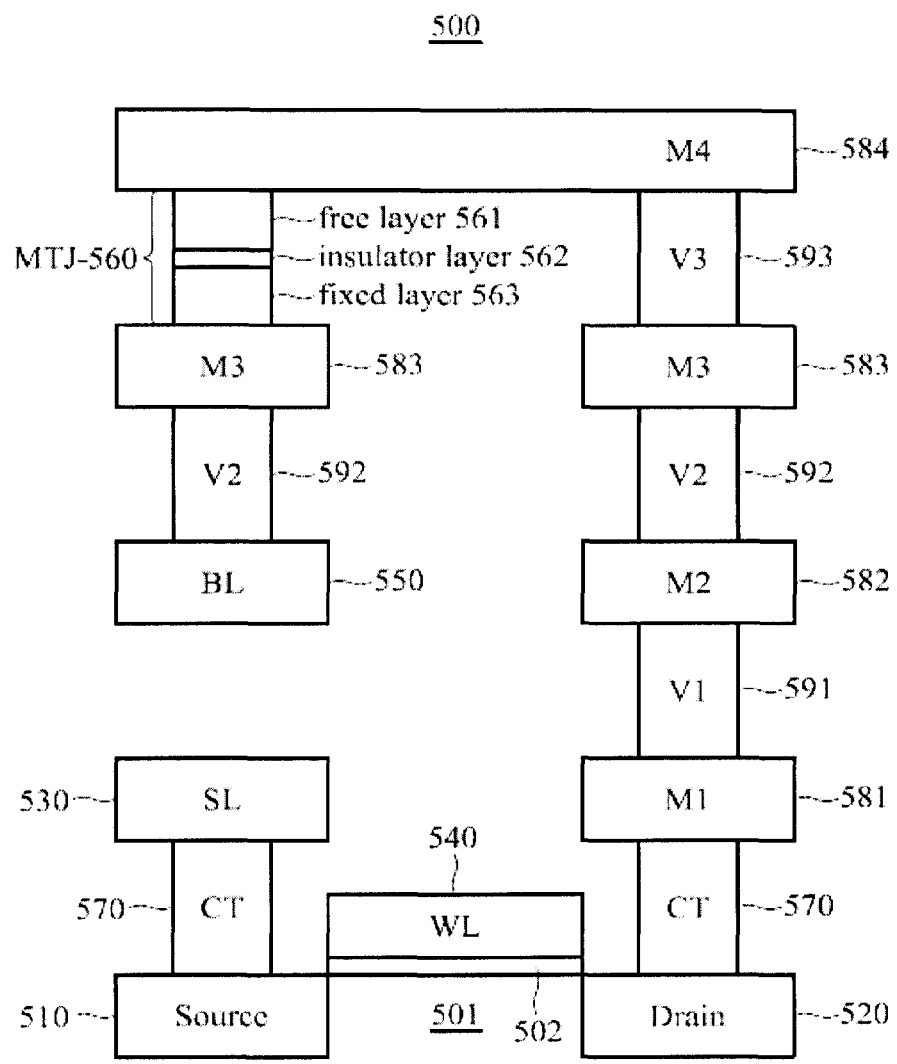
FIG. 5 shows a cross-sectional view of a first MRAM memory cell with a reverse connection MTJ device according to one or more embodiments of the present disclosure.

FIG. 5 shows a cross-sectional view of a first MRAM memory cell with a reverse connection MTJ device of FIG. 3 according to one or more embodiments of the present disclosure. The memory cell 500 may be formed on a substrate such as a semiconductor substrate including for example, silicon, germanium, and/or a compound semiconductor material. The switching device of the memory cell may include a semiconductor layer that serves as an active region 501, a source region 510, and a drain region 520. The source region 510 is coupled to the SL 530 through a contact layer CT 570. The WL 540 is separated from the active region 501 by a gate insulating layer 502 to provide the gate voltage to turn on the switching device. The drain region 520 may be coupled to the MTJ device 560 of the MRAM memory cell through the contact layer CT 570, a first metal layer (M1) 581, a first via layer (V1) 591, a second metal layer (M2) 582, a second via layer (V2) 592, a third metal layer (M3) 583, a third via layer (V3) 593, and a fourth metal layer (M4) 584. To form the gate insulating layer 502, a dielectric layer such as a silicon oxide layer may be deposited on the substrate, and the dielectric layer may be patterned through a photolithography method. To form the SL 530, CT 570, M1 581, V1 591, M2 582, V2 592, M3 583, V3 593, and M4 594 layers, a metal material may be successively deposited on the substrate, and the metal material may be patterned through a photolithography method.

The reverse connection MTJ device 560 of the memory cell 500 may be formed between M3 583 and M4 584 layers. The MTJ device includes a free layer 561, an insulator layer 562, and a fixed layer 563. To form the MTJ device 560, the fixed layer 563 may be deposited first, followed by the insulator layer 562, and the free layer 561. The free layer 561 and the fixed layer 563 are ferromagnetic layers. The free layer 561 and the fixed layer 563 may include Co, Fe, Ni, Mn, B, and/or their alloys. The insulator layer 562 has a nonmagnetic composition and may be formed from any suitable material that may function as an electrical insulator. The insulator layer 562 may electrically insulate the free layer 561 from the fixed layer 563 independently, or in conjunction with other layers (not illustrated) interposing the free layer 561 and the fixed layer 563. The free layer 561, the insulator layer 562, and the fixed layer 563 may be formed by conventional processes such as photolithography, chemical vapor deposition (CVD), physical vapor deposition (PVD), electro-chemical deposition, molecular manipulation, etching, chemical mechanical polish, and/or other processes.

The reverse connection MTJ device 560 of the memory cell 500 may be realized by connecting the free layer 561 to the drain region 520 of the switching device through M4 584, V3 593, M3 583, V2 592, M2 582, V1 591, M1 581, and CT 570 layers as described before. The fixed layer 563 of the MTJ device 560 may be connected to BL 550 through M3 583 and V2 592 layers where BL 550 may be deposited on the same layer as M2 582.

Figure 6:
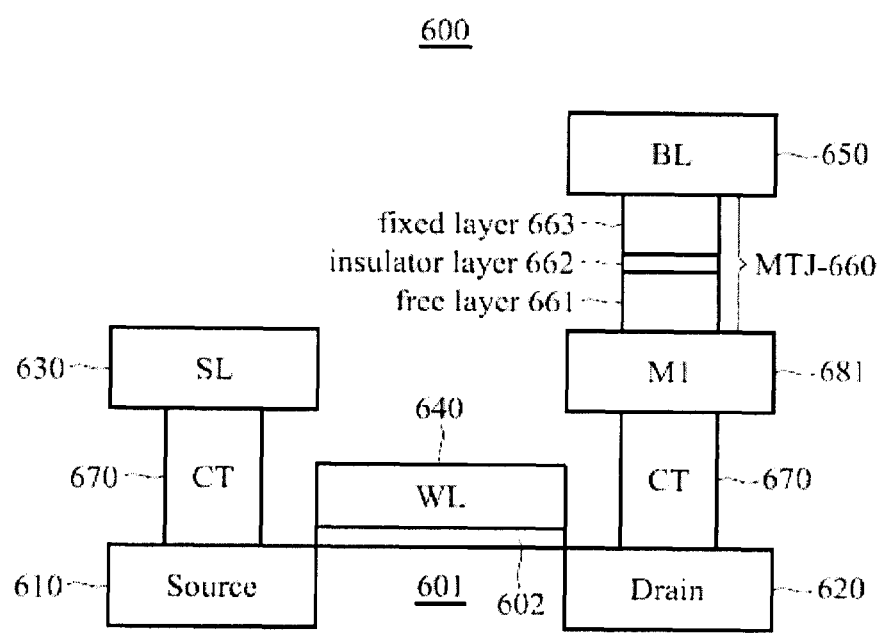
FIG. 6 shows a cross-sectional view of a second MRAM memory cell with a reverse connection MTJ device according to one or more embodiments of the present disclosure.

Alternatively, the free layer of the reverse connection MTJ device may be deposited first before the fixed layer. FIG. 6 shows a cross-sectional view of a second MRAM memory cell 600 with a reverse connection MTJ device of FIG. 3 according to one or more embodiments of the present disclosure. The switching device of the memory cell of FIG. 6 has the same structure as that in FIG. 5 with an active region 601 separated by a gate insulating layer 602 from WL 640, a source region 610 coupled to SL 630 through a contact layer CT 670, and a drain region 620 coupled to the first metal layer (M1) 681 through CT 670.

The MTJ device 660 may be formed between M1 682 and a BL 650 deposited at an upper metal layer. To form the MTJ device 660, the free layer 661 may be deposited first, followed by the insulator layer 662, and the fixed layer 663. The reverse connection MTJ device 660 is realized by connecting the free layer 661 to the drain region 620 of the switching device through M1 681 and CT 670. The fixed layer 663 may be directly connected to BL 650.

Although embodiments of the present disclosure have been described, these embodiments illustrate but do not limit the disclosure. It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

We claim:

1. A memory cell of a magnetic random access memory (MRAM) comprising:
   a switching device comprising a source, a gate, and a drain; and
   a magnetic tunnel junction (MTJ) device comprising a free layer, a fixed layer, and an insulator layer, wherein the insulator layer is interposed between the free layer and the fixed layer, the MTJ device situated above the drain or the source so that a conceptual, centered axis of the MJT device intersects the drain or the source respectively;
   wherein the free layer of the MTJ device is connected to the drain of the switching device, the fixed layer of the MTJ device is connected to and situated above a bit line (BL), the gate of the switching device is connected to a word line (WL), and the source of the switching device is connected to a sense line (SL).

2. The memory cell of claim 1, wherein a magnetization direction of the free layer is switched using spin-torque transfer (STT).

3. The memory cell of claim 2, wherein the magnetization direction of the free layer is switched to be parallel to a magnetization direction of the fixed layer by driving the free layer of the MTJ device to a sufficiently positive voltage with respect to the fixed layer of the MTJ device to generate a required current to transfer angular momentum of electrons polarized in an identical direction as the magnetization direction of the fixed layer to the free layer.

4. The memory cell of claim 2, wherein the magnetization direction of the free layer is switched to be anti-parallel to a magnetization direction of the fixed layer by driving the fixed layer of the MTJ device to a sufficiently positive voltage with respect to the free layer of the MTJ device to generate a required current to transfer angular momentum of electrons polarized in an opposite direction from the magnetization direction of the fixed layer to the free layer.

5. The memory cell of claim 3, wherein a current capability of the memory cell is more than the required current to switch the magnetization direction of the free layer to be parallel to the magnetization direction of the fixed layer.

6. The memory cell of claim 4, wherein a current capability of the memory cell is more than the required current to switch the magnetization direction of the free layer to be anti-parallel to the magnetization direction of the fixed layer.

7. The memory cell of claim 1, wherein an anti-ferromagnetic layer is used to fix a magnetization direction of the fixed layer.

8. The memory cell of claim 1, wherein a magnetization direction of the free layer is read by applying a voltage through the MTJ device and measuring a current through the MTJ device to determine a resistance of the MTJ device.

9. A method of forming a memory cell of a magnetic random access memory (MRAM) comprising:
    forming a substrate;
    forming a switching device comprising a source region, an active region, and a drain region;
    forming a magnetic tunnel junction (MTJ) device above the source region or the drain region and above a bit line (BL), the MJT device comprising a free layer, a fixed layer, and an insulator layer, wherein the insulator layer is interposed between the free layer and the fixed layer and a conceptual axis of the MJT device;
    connecting the source region to a sense line (SL);
    forming a write line (WL) to control the switching device through the active region;
    connecting the drain region to the free layer of the MTJ device; and
    connecting the fixed layer of the MTJ device to the bit line.

10. The method of claim 9, wherein connecting the drain region to the free layer of the MTJ device comprises forming one or more metal layers, forming one or more vias, and connecting the drain region to the free layer through the one or more metal layers and the one or more vias.

11. The method of claim 9, wherein forming the MTJ device comprises forming the fixed layer first followed by forming the insulator layer and then forming the free layer.

12. The method of claim 9, wherein connecting the fixed layer of the MTJ device to the BL comprises forming one or more metal layers, forming one or more vias, and connecting the fixed layer to the BL through the one or more metal layers and the one or more vias.

13. The method of claim 9, wherein forming the MTJ device comprises forming the free layer first followed by forming the insulator layer and then forming the fixed layer.

14. The method of claim 9, further comprising switching a magnetization direction of the free layer using spin-torque transfer (STT) to be parallel to a magnetization direction of the fixed layer, wherein said switching to parallel moments comprises driving the free layer of the MTJ device to a sufficiently positive voltage with respect to the fixed layer of the MTJ device to generate a required current to transfer angular momentum of electrons polarized in an identical direction as the magnetization direction of the fixed layer to the free layer.

15. The method of claim 9, further comprising switching a magnetization direction of the free layer using spin-torque transfer (STT) to be anti-parallel to a magnetization direction of the fixed layer, wherein said switching to anti-parallel moments comprises driving the fixed layer of the MTJ device to a sufficiently positive voltage with respect to the free layer of the MTJ device to generate a required current to transfer angular momentum of electrons polarized in an opposite direction from the magnetization direction of the fixed layer to the free layer.

16. The method of claim 14, wherein a current capability of the memory cell is more than the required current to switch the magnetization direction of the free layer to be parallel to the magnetization direction of the fixed layer.

17. The method of claim 15, wherein a current capability of the memory cell is more than the required current to switch the magnetization direction of the free layer to be anti-parallel to the magnetization direction of the fixed layer.

18. The method of claim 9, wherein forming the MTJ device comprises forming an anti-ferromagnetic layer to fix a magnetization direction of the fixed layer.

19. The method of claim 9, wherein reading a magnetization direction of the free layer comprises applying a voltage through the MTJ device and measuring a current through the MTJ device to determine a resistance of the MTJ device.

20. A memory device comprising:
    a memory cell comprising:
        a substrate;
        a switching device comprising a source region, an active region, and a drain region;
        a magnetic tunnel junction (MTJ) device situated above the source region or the drain region, the MTJ device comprising a free layer connected to the drain region, a fixed layer, and an insulator layer, wherein the insulator layer is interposed between the free layer and the fixed layer;
        a sense line (SL) connected to the source region;
        a write line (WL) to control the switching device through the active region; and
        a bit line (BL) connected to the fixed layer of the MTJ device and situated below the fixed layer;
    wherein a current capability of the memory cell is more than a required current to switch a magnetization direction of the free layer to be parallel to a magnetization direction of the fixed layer, and more than a required current to switch the magnetization direction of the free layer to be anti-parallel to the magnetization direction of the fixed layer.

* * * * *